(12) United States Patent
Holzbock et al.

(10) Patent No.: US 6,409,893 B1
(45) Date of Patent: Jun. 25, 2002

(54) PHOTOELECTROCHEMICAL CELL

(76) Inventors: Jurgen Holzbock, Am Graffweg 1, D-45886 Gelsenkirchen; Olaf Knebel, Wilhelmshöhe 1, D-44388 Dortmund; Ingo Uhlendorf, Paulinenstrasse 13, D-45881 Gelsenkirchen, all of (DE)

( * ) Notice: Subject to any disclaimer, the term of this patent is extended or adjusted under 35 U.S.C. 154(b) by 33 days.

(21) Appl. No.: 09/606,000

(22) Filed: Jun. 29, 2000

(30) Foreign Application Priority Data

Jun. 29, 1999 (DE) .......................................... 199 29 509

(51) Int. Cl.⁷ ................................................. C25B 9/00
(52) U.S. Cl. .................................. 204/242; 204/290.11
(58) Field of Search ............................. 204/242, 290.11

(56) References Cited

U.S. PATENT DOCUMENTS

| | | | | |
|---|---|---|---|---|
| 4,414,080 A | * | 11/1983 | Williams et al. | 204/290.11 X |
| 4,461,691 A | * | 7/1984 | Frank | 204/242 |
| 4,650,555 A | * | 3/1987 | Frank | 204/290.11 X |

FOREIGN PATENT DOCUMENTS

DE           4225576          2/1994

OTHER PUBLICATIONS

J. Electrochem Soc.: Electrochemical Science and Technology, vol. 129, No. 10, pp. 2261–2265 (Oct. 1982).

Teketel Yohannes, O. Inganas, "Photoelectrical Studies of the junction between poly[3–(4–octylphenyl) thiophene] and a redox polymer electrolyte," Solar Energy Materials and Solar Cells 51 (1998) pp. 193–202, (No Month).

* cited by examiner

*Primary Examiner*—Donald R. Valentine
(74) *Attorney, Agent, or Firm*—Patton Boggs LLP

(57) ABSTRACT

A photoelectrochemical cell, with a work electrode and a counter electrode that is arranged opposite the work electrode and whose electrochemically active surfaces are facing each other and with an electrolyte being arranged between the surfaces which contains a redox system, with the surface of the counter electrode being catalytically active, is characterized by the fact that the catalytically active surface of the counter electrode contains at least one polymer and/or at least one salt of a polymer, which has been doped to an intrinsically electrically conductive polymer through the redox system of the electrolyte.

2 Claims, No Drawings

PHOTOELECTROCHEMICAL CELL

The invention relates to a photoelectrochemical cell with a work electrode and a counter electrode which is arranged opposite the work electrode and whose electrochemically active surfaces are facing each other, with an electrolyte being arranged between the surfaces that contains a redox system, with the surface of the counter electrode being catalytically active. The invention furthermore relates to a method for producing a counter electrode for a photoelectrochemical cell.

A photoelectrochemical cell similar to the one described above is disclosed, for example, in EP 0 333 641 B1. The work electrode therein comprises a polycrystalline metal oxide semiconductor with a chromophore layer as the electrically active surface. Titanium oxide is the preferred choice for the metal oxide semiconductors and is applied to a glass panel that is coated with a conductive layer. For such photoelectrochemical cells, conductive coated glass, to whose surface a catalytically active material has been applied, is also used for the counter electrode. WO 97/12382 suggests the usage of platinum.

Another setup of a photoelectrochemical cell in which a carbon layer is used for the counter electrode is described in DE 195 40 712 A1. This design must generally have a large thickness to allow the flow of sufficient currents. Since the catalytic activity of carbon is low, it must have a large surface or be catalytically activated.

The counter electrode is an important component of the photoelectrochemical cell. The main requirement for the catalytically active material is that the transmission of electrons in the electrolytes must occur with the lowest amount of kinetic inhibition possible, i.e. that the exchange current density $I_o$ must be as high as possible for this process.

The current in a photoelectrochemical cell of the kind described above is generated when a dye that is adsorbed on the porous semiconductor injects electrons into the semiconductor when it is stimulated by light energy. This way, the electrons get to the external circuit through the conductive substrate coating and can perform their job there. The oxidized dye is reduced from the electrolyte through electrons, with the electrolyte filling the entire cell all the way to the counter electrode. The electrolyte generally contains a redox system, e.g. iodine/iodide, bromine/bromide or other systems, as they are described in EP 0 333 641 B1, for example.

In order to be able to close the circuit in the photoelectrochemical cell, the electrons arriving from the external circuit must be transmitted back into the electrolyte on the counter electrode. The catalytically active material of the counter electrode facilitates this process.

However, platinum, which is mentioned in WO 97/12382 as the catalytically active substance, has the disadvantage that it represents a relatively expensive component of the cell. WO 97/12382 emphasizes the combination of platinum with iodine/iodide electrolytes. Findings have now shown that the platinum dissolves through a reaction with iodine, a reaction which is very slow but which will shorten the life of the cell. Therefore, searches are in progress for alternatives to this catalyst, with the above-described carbon layers explained in DE 195 40 712 A1 not being regarded as the optimal choice.

The task of the invention consists in making available a photoelectrochemical cell with a catalytically active counter electrode, which foregoes expensive materials and nevertheless displays high efficiency.

This task is resolved with a photoelectrochemical cell in accordance with claim 1. A method for producing a counter electrode for such a photoelectrochemical cell is the object of claim 7.

According to the invention, the catalytically active surface of the counter electrode is equipped with at least one polymer and/or at least one salt of a polymer with a sequence of aromatic rings in the main chain.

The catalytic activity is evaluated with regard to the redox system that is employed.

It was found that these catalytically active polymers have long-term stability and can be applied with the usual techniques. Additionally, no tempering step, as is generally necessary for platinum, is required to achieve catalytic activity.

The polymer is preferably one based on polyaniline, polypyrrole or polythiophene.

In a particularly preferred version, the catalytically active surface contains polyethylenedioxythiopene or consists of it entirely.

The catalytically active polymer and/or the polymer salt can be added to graphite powder and/or soot. This can lead to a conductive layer together with the catalyst, i.e. the carbon layers themselves are activated catalytically and serve in turn as conductive layers.

It is also possible for the catalytically active polymer and/or its salt to be a mixture with at least one electrically non-conductive polymer or polymer salt. This electrically non-conductive polymer can be one on the basis of styrene, e.g. polystyrenesulfonate.

The invented photoelectrochemical cells can be arranged as modules. The counter electrode and a neighboring work electrode are then connected with a circuit element. This circuit element can consist of a mixture of carbon with the catalytically active polymers or polymer salts.

The method for producing a counter electrode for a photoelectrochemical cell comprises the following steps:

making available a substrate and applying a coating, which consists of at least one polymer and/or one salt of a polymer with a sequence of aromatic rings in the main chain, onto the substrate through electrochemical precipitation, spraying, printing, immersion of the substrate into a solution or suspension that contains the polymer or its salts or the appropriate monomers or direct polymerization on the substrate.

A starting substance for a catalytically active coating with polyethylenedioxythiopene that is particularly suited for a iodine/iodide redox system can be, for example, 3,4-ethylenedioxythiophene, which is marketed by Bayer AG under the name Baytron M.

If the photoelectrochemical cell should contain a separate electrically conductive layer, then that is applied first and subsequently the catalytically active coating is applied on the electrically conductive layer. We would like to refer to the alternatives concerning the addition to graphite powder and/or soot addressed above.

A bonding agent, e.g. hydrosilicon, is preferably used for the catalytically active coating.

The features of the invention disclosed in the above description and in the claims can be of importance for the realization of the invention both individually and in any random combination.

What is claimed is:

1. A photoelectrochemical cell with one work electrode and one counter electrode that is arranged opposite the work electrode, whose electrochemically active surfaces are facing each other and with an electrolyte being provided for between the surfaces which contains a redox system, with the surface of the counter electrode being catalytically active, characterized by the fact that the catalytically active surface including a polyethylenedioxythiophene of the counter electrode containing at least one polymer based on polyaniline, polypyrrole or polythiopene.

2. Photoelectrochemical cell with one work electrode and one counter electrode that is arranged opposite the work electrode, whose electrochemically active surfaces are facing each other and with an electrolyte being provided for between the surfaces which contains a redox system, with the surface of the counter electrode being catalytically active, characterized by the fact that the catalytically active surface of the counter electrode contains at least one polymer and/or at least one salt of a polymer with a sequence of aromatic rings in the main chain, wherein the polymer and/or its salt is available as a mixture of the graphite powder and/or soot.

* * * * *

UNITED STATES PATENT AND TRADEMARK OFFICE
CERTIFICATE OF CORRECTION

PATENT NO. : 6,409,893 B1
DATED : June 25, 2002
INVENTOR(S) : Jurgen Holzbock, Olaf Knebel and Ingo Uhlendorf It is certified that error appears in the above-identified patent and that said Letters Patent is hereby corrected as shown below:

<u>Title page,</u>
Insert item [73] as follows:
-- [73] Assignee: Institut Fur Angewandte Photovoltaik GmbH (Gelsenkirchen, Germany) --

Signed and Sealed this

Sixth Day of May, 2003

JAMES E. ROGAN
*Director of the United States Patent and Trademark Office*